US010466030B2

(12) United States Patent
Gurley et al.

(10) Patent No.: US 10,466,030 B2
(45) Date of Patent: Nov. 5, 2019

(54) DUAL MEASUREMENT DISPLACEMENT SENSING TECHNIQUE

(71) Applicant: AUBURN UNIVERSITY, Auburn, AL (US)

(72) Inventors: Austin R. Gurley, Leeds, AL (US); David G. Beale, Auburn, AL (US); Royall M. Broughton, Auburn, AL (US)

(73) Assignee: Auburn University, Auburn, AL (US)

( * ) Notice: Subject to any disclaimer, the term of this patent is extended or adjusted under 35 U.S.C. 154(b) by 151 days.

(21) Appl. No.: 15/593,885

(22) Filed: May 12, 2017

(65) Prior Publication Data

US 2017/0328699 A1 Nov. 16, 2017

Related U.S. Application Data

(60) Provisional application No. 62/335,189, filed on May 12, 2016, provisional application No. 62/505,227, filed on May 12, 2017.

(51) Int. Cl.
| | | |
|---|---|---|
| G01B 7/14 | (2006.01) |
| G01D 5/353 | (2006.01) |
| G01D 5/347 | (2006.01) |
| G01D 5/26 | (2006.01) |
| G01D 5/12 | (2006.01) |
| H03M 1/28 | (2006.01) |
| G01B 11/06 | (2006.01) |
| G01D 5/16 | (2006.01) |
| G01B 7/02 | (2006.01) |

(52) U.S. Cl.
CPC ............... *G01B 7/14* (2013.01); *G01B 7/02* (2013.01); *G01B 11/0608* (2013.01); *G01D 5/12* (2013.01); *G01D 5/16* (2013.01); *G01D 5/266* (2013.01); *G01D 5/347* (2013.01); *G01D 5/35383* (2013.01); *H03M 1/282* (2013.01)

(58) Field of Classification Search
CPC ...................... G01L 37/02–04; B65H 61/00
See application file for complete search history.

(56) References Cited

U.S. PATENT DOCUMENTS

| | | | | |
|---|---|---|---|---|
| 5,006,809 A * | 4/1991 | Mang | ..................... | G01R 27/02 324/603 |
| 5,245,291 A * | 9/1993 | Fujimura | ............... | G01B 7/026 324/617 |
| 5,309,647 A * | 5/1994 | Kruchowy | ............. | B65H 61/00 33/716 |
| 5,923,175 A * | 7/1999 | Richardson | ............ | G01R 27/04 324/632 |
| 6,307,380 B1 * | 10/2001 | Hirai | ....................... | G01D 5/14 324/532 |

(Continued)

Primary Examiner — Huy Q Phan
Assistant Examiner — David B Frederiksen
(74) Attorney, Agent, or Firm — Stephen H. Hall; Ryan J. Letson; Bradley arant Boult Cummings LLP

(57) ABSTRACT

A method for determining a length of a span of electrically conductive material, comprising a first voltage measurement across the entire span, and a second voltage measurement across a constant-length segment of the span. The dual measurements allow the calculation of the span length in a manner that is robust to many disturbances including ambient temperature, material temperature, and material stress and fatigue.

8 Claims, 4 Drawing Sheets

(56) References Cited

U.S. PATENT DOCUMENTS

| | | | |
|---|---|---|---|
| 6,438,163 B1* | 8/2002 | Raghavan | H03G 3/3052 |
| | | | 324/617 |
| 7,098,645 B1* | 8/2006 | Zhu | G01B 7/02 |
| | | | 324/534 |
| 2004/0261411 A1 | 12/2004 | MacGregor | |
| 2006/0048511 A1 | 3/2006 | Everson et al. | |
| 2006/0167642 A1* | 7/2006 | Ferrer | G01B 7/02 |
| | | | 702/79 |
| 2010/0063772 A1* | 3/2010 | Kim | G01B 7/02 |
| | | | 702/159 |
| 2013/0134991 A1* | 5/2013 | Higuma | G01B 7/02 |
| | | | 324/635 |
| 2013/0241718 A1* | 9/2013 | Wang | G08B 6/00 |
| | | | 340/407.1 |
| 2014/0346980 A1 | 11/2014 | Suissa et al. | |

* cited by examiner

DUAL MEASUREMENT DISPLACEMENT SENSING TECHNIQUE

CROSS-REFERENCE TO RELATED APPLICATIONS

The present invention claims the benefit under U.S. Provisional Patent Application Ser. No. 62/335,189, filed 12 May 2016 and U.S. Provisional Patent Application Ser. No. 62/505,227, filed 12 May 2017, which is incorporated by reference into the present disclosure.

REFERENCE TO GOVERNMENT GRANT

This invention was supported by the Alabama Space Grant Consortium, NASA Training Grant NNX15AJ18H.

TECHNICAL FIELD

This invention relates generally to length measuring devices and methods, and more particularly the present invention relates to determining a length or span of a conductive material using electrical measurements of the material. More particularly still, the present invention has gainful application in the control of shape memory alloy devices.

BACKGROUND

The need to measure of a length of conductive materials such as wires, cords, and ribbons is commonplace. It may be useful to know the length of a material that has been extended across a span, or to know the change in length of the material due to straining or stretching of the material itself. Many sensing techniques to determine length of such materials are demonstrated in the prior art which require secondary devices which sense the length or change in length. While many of these provide accurate measurements and various useful features, there are drawbacks to such devices. Typically, such devices increase the size, mass, and cost of the entire system and can be intrusive to the functionality of the material. It is desirable to determine the length of materials without such external sensors. Devices in the prior art have sought overcome these drawbacks by measuring properties of the material itself which might vary with changes in length or strain. More specifically, it is inexpensive and unobtrusive to measure the electrical properties of the material to sense such a change. Examples of this concept are demonstrated in prior art. For instance, U.S. Pat. No. 3,922,789 measures the electrical resistance of a wire payed-out from a reel and uses this measured electrical resistance to determine the wire length. Nevertheless, there continue to be drawbacks in determining length of conductive materials, as these methods cannot compensate for the elastic strain of the wire due to stress or changes in diameter due to wear.

Shape Memory Alloys (SMA) are special alloyed metals that undergo a large change in crystal geometry when heated and cooled that causes the alloy to expand and contract with large force. Shape memory alloys are utilized as solid-state actuators in many applications. These actuators have benefits including silent operation, high strength-to-weight ratio, and direct linear motion. Because the material models are very complex, the feedback control of SMA actuators is difficult and SMA actuators have not become prevalent in robot or machine design except in places where binary (two-position) motion is all that is needed. This binary control allows the model to be as simple as two known positions; the state when hot and when cold. However, a more useful actuator is one that is easily commanded to obtain a desired position anywhere within its range of capability, not just at set limits. To achieve this, generally a position sensor is used in a feedback loop with the actuator. While sensor feedback is feasible in many cases, the great benefits of SMA actuators (high payload-to-weight ratios, simplicity, and small size) cannot be realized in this configuration because the added sensor adds complexity, weight and volume. Ideally, the changing electrical properties of the SMA material itself can be used as a position sensor. But because the behavior of the SMA motion and electrical properties are nonlinear and exhibit hysteresis, it has proven difficult to create a robust self-sensing control scheme.

Several US patents disclose SMA actuators that use the electrical resistivity of the wire for sensing. The electrical resistance of an SMA wire or ribbon has been used as a position sensor in U.S. Pat. Nos. 7,886,535, 8,339,073. These methods measure the resistance of the entire length of SMA material, and anticipate the electrical resistivity of the entire material to change in proportion to position, stress or temperature. None of these methods can account for the fact that SMA electrical resistance is not a function of strain alone, but is also affected greatly by stress, fatigue, and ambient conditions.

Accordingly, there is a need in the art to provide an improved apparatus and method for determining a reliable and robust estimate of material length. It is to such that the present invention is directed.

BRIEF SUMMARY OF THE INVENTION

The present invention meets the need in the art by providing a method for estimating length, comprising the steps of:
  a. providing a span of an electrically conductive material,
  b. applying a voltage across the entire said span of electrically conductive material from a base of said span to an opposing base thereof,
  c. determining a first voltage which is equal to the applied voltage across said span of electrically conductive material, said first voltage determined by use of a voltage sensor or by a predetermined knowledge of said applied voltage
  d. measuring a second voltage at a fixed probe location within said span of electrically conductive material, said fixed probe location being a predetermined distance from the base of said span of electrically conductive material,
whereby the length of said span of electrically conductive material is determined by computing the ratio of said first voltage to said second voltage and scaling that ratio by the distance from the base of said fixed probe.

In another aspect, the present invention provides an apparatus for estimating a length of an electrically conductive material, comprising a span of electrically conductive material supported between a first base and an opposing second base thereof, a source of electrical voltage attached at said based of said span for applying a predetermined first voltage to said span; and a voltage probe having a sensor for measuring voltage and movable to a selected probe location within said span, said selected probe location being a predetermined distance from the base of said span of conductive material, for determining a second voltage. The length of said span of conductive material is determined by computing the ratio of said first voltage to said second voltage and scaling that ratio by the distance of the fixed probe location from the first base.

Accordingly, it is the object of the present invention to provide reliable and robust estimate of material length using only electrical measurements of the material. It is a further object of the present invention to ensure that measurement is accurate even when strain, ambient condition, wear, and fatigue of the material are not otherwise known or measured. Another object is to use this accurate measurement in a feedback-control system in shape memory alloy materials.

Other advantages, features, and objects of the present invention will become readily apparent upon a reading of the following detailed description of the invention with reference to the drawings and in conjunction with the appended claims.

Figure 1A:
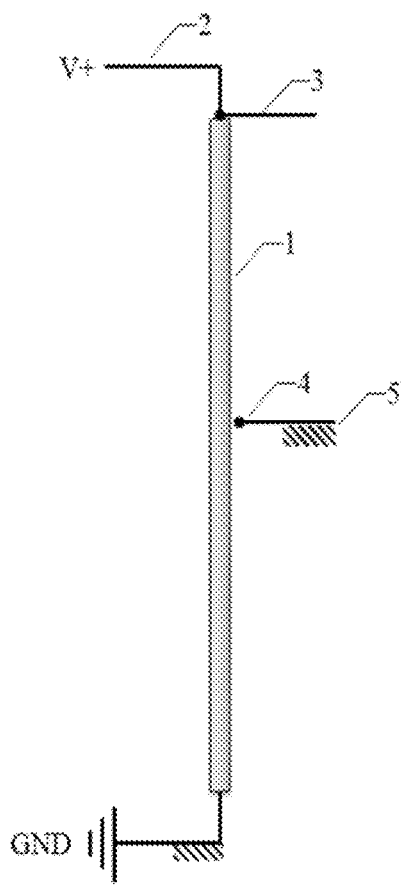
FIGS. 1A and 1B illustrate a schematic of the measuring technique according to the present invention applied to a length of an electrically conductive material.

DRAWINGS—REFERENCE NUMERALS 1. span of conductive material
2. applied voltage
3. first voltage
4. second voltage
5. fixed probe location
6. printed circuit board
7. first electrical connection
8. coil-spring
9. pivoting beam
10. second electrical connection
11. third electrical connection
12. adjustable voltage supply
13. feedback controller
14. reference position

DETAILED DESCRIPTION—EMBODIMENT 1—FIGS. 1-2

In reference to the drawings, in which like parts have like reference numerals, FIG. 1A illustrates a span of electrically conductive material 1 attached at respective opposing first base and second base, with an applied voltage 2 across the span from a source denoted V⁺ to sink at electrical ground denoted GND. The end of the material near the source is free to move, while the end near ground is fixed. A first voltage 3 is determined by measurement with a voltage sensor connected to the end of the span of material 1 such that it moves with the end of the span of material 1, or alternatively by a predetermined knowledge of the magnitude of applied voltage 2. A second voltage 4 is measured at fixed probe location 5 within the span of the conductive material 1.

Figure 1B:
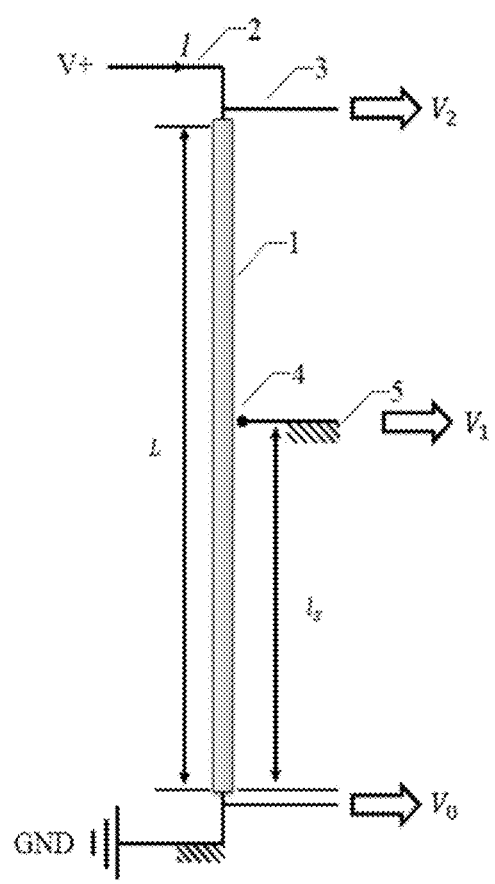

Looking now to FIG. 1B, the mathematical terms used to calculate the total wire length are denoted. The span of material 1 has total length L, which may vary with strain. A measurement of the input voltage 2, (denoted $V_2$), is made at the source voltage level (denoted V⁺). A second measurement of voltage $V_0$ is made at the bottom of the span of material 1 which is generally the sink ground voltage level (denoted GND). Along the span of the material, a sliding-contact probe is positioned a fixed distance 5 (denoted $l_s$) from the material 1 end at a selected probe location. At the fixed probe location 5, a second voltage measurement 4 (denoted $V_1$) is made. The voltage difference ($V_2$–GND) will vary in a complex manner as the span of material 1 extends and contracts, heats and cools, fatigues, and is tensioned. The physical distance between the points 3 and 4 changes as length L varies. The voltage difference ($V_2$–GND) will also change, however the distance between GND and 4 will remain a constant distance $l_s$.

Figure 2A:
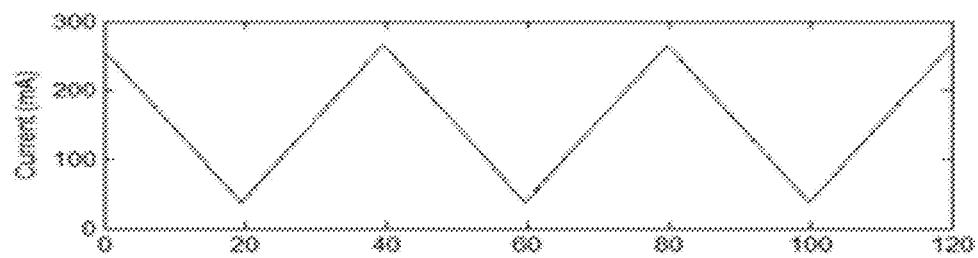
FIGS. 2A-2D illustrate the results of an experiment validating the performance of the method of the present invention when applied to shape memory alloy wire.
Figure 2B:
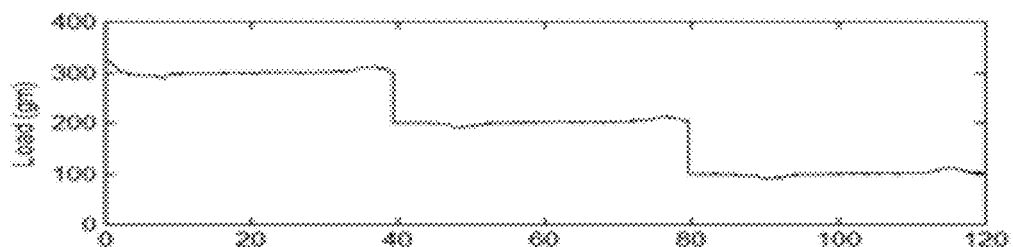
Figure 2C:
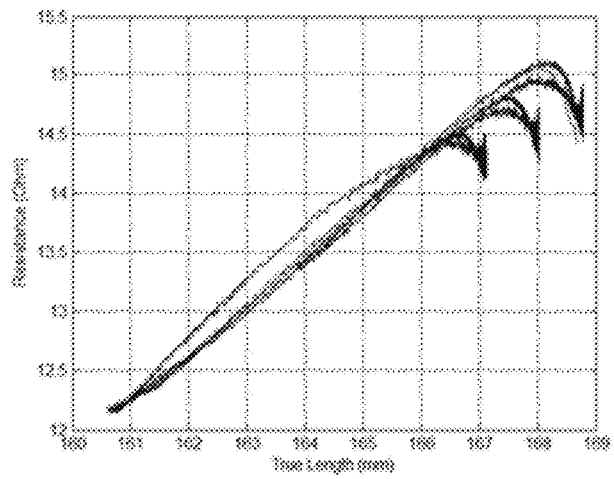
Figure 2D:
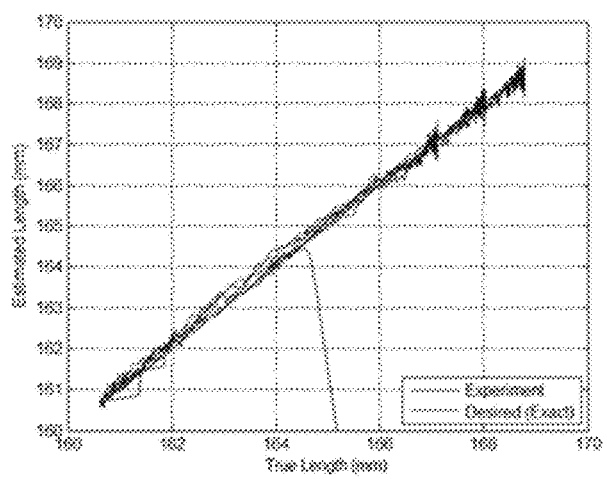

Looking now to FIGS. 2A-2D, the results of an experiment using the present invention are shown. The span of material in this case is a shape memory alloy wire which contracts when electrically heated, and expands when cooled in ambient air. FIG. 2A shows the electrical input to the wire. The span of material is electrically heated by varying the electrical current in a saw-tooth manner, with period of 40 seconds. This input is repeated three times. Because the material is a shape memory alloy, this varying current heats the wire and causes it to contract and extend. FIG. 2B shows the tensile stress applied to the material which also causes it to strain. During each of the three electrical repetitions, the tensile load applied to the wire is regulated to one of three different magnitudes. FIG. 2C shows the electrical resistance of the entire wire. It is seen in FIG. 2C that electrical resistance alone is not a robust sensor of position. The relationship between electrical resistance and position is complicated by changing wire temperature, load, hysteresis, and ambient conditions. FIG. 2D shows the wire length predicted using the method of the present invention. It is seen that none of temperature, load, hysteresis, nor ambient conditions adversely affect the estimate of length using the present invention.

Operation

Consider that the electrical resistivity of the material is constant along the entire length so long as the entire length is subject to similar electrical current, ambient temperature, and stress—all of which are reasonable assumptions for a wire, cable, or ribbon. Then, the relationship between the voltage measurements (3,4), the total length L of the span of material 1, and the fixed probe location 5 whose distance from GND is denoted $l_s$, is:

$$L = l_s * \frac{V_2 - GND}{V_1 - GND}$$

If measurement at $V_0$ is taken at electrical ground, the relationship between material length and the measurements can be simplified, when $V_0$=0, then $$L = l_s * \frac{V_2}{V_1}$$

In many cases, the supply voltage $V_2$=V⁺ is known without direct measurement, such as when a battery is connected to the material. In such cases, it is apparent that the calculation can be simplified farther; when $V_2$=V⁺ then $$L = l_s * \frac{V^+}{V_1}$$

It is practical that the sliding contact at midpoint 4 be formed from a spring-loaded probe, at a bend in the material, or in other practical manners that ensure continual contact with the material in all heating and loading conditions.

It should be noted that this technique is most accurate when the electrical noise is small. Noise is also reduced when $V_1$ is as large as possible with respect to $V_2$— thus in the application of this technique $l_s$ should be as large as possible with respect to L. The invention assumes the state of the wire (its temperature, stress, strain, and crystal state) is the same in the constant-length segment as it is in the entire span of the material—this assumption is also most valid when the measurement $l_s$ is as large as possible with respect to L

DETAILED DESCRIPTION—EMBODIMENT 2—FIG. 3

Figure 3:
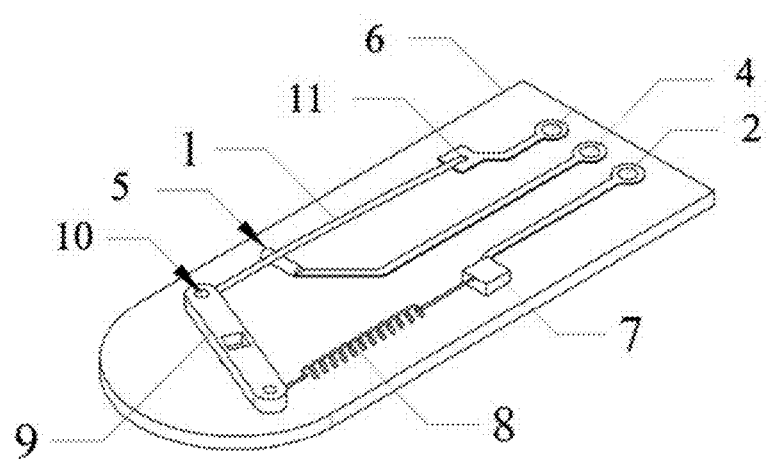
FIG. 3 illustrates an embodiment of the present invention applied with a single shape memory alloy wire used as an actuator on a printed circuit board.

Looking now to FIG. 3, an alternate embodiment of the present invention is shown, sensing the position of a span of material 1 which is formed from shape memory, and which actuates a rotary actuator on a printed circuit board. A substrate printed circuit board 6 contains an electrical trace from source of applied voltage 2, to the first electrical-mechanical connection 7 where an electrically conductive coil-spring 8 is fastened. Coil-spring 8 is fastened to one end of an electrically conductive pivoting beam 9 which rotates about a central pin. At the opposite end of pivoting beam 9, the span of material 1 is fastened at connection point 10. The path from applied voltage 2 to second electrical-mechanical connection 10—passing through first electrical-mechanical connection 7, through conductive coil-spring 8, through conductive pivoting beam 9—creates an electrical path with minimal electrical resistance. Span of conductive material 1 extends from second electrical-mechanical connection 10 to third electrical-mechanical connection 11, touching the fixed probe location 5 at an intermediate location. Third electrical-mechanical connection 11 is intended to be electrical ground. Second voltage 4 is measured at the fixed probe location 5.

Figure 4:
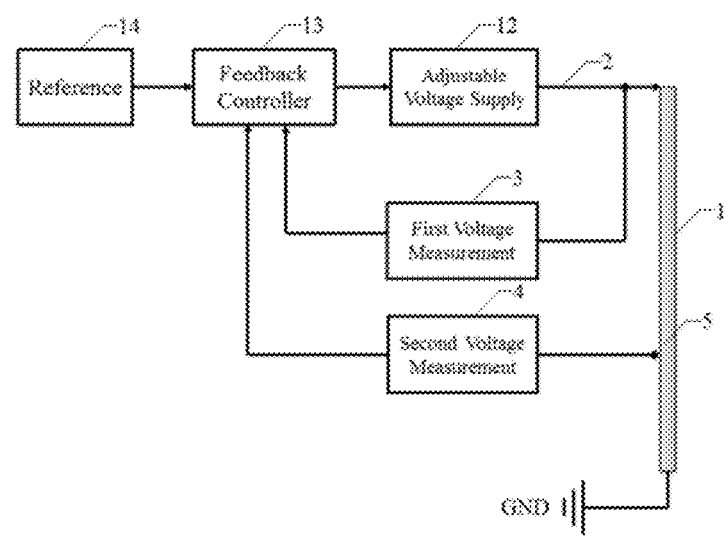
FIG. 4 illustrates the application of the present invention with a shape memory alloy in a feedback control system.

FIG. 4 illustrates an application of the present invention as used in a feedback control loop. A feedback controller 13 such as a computer accepts predetermined reference input 14 as well as first voltage 3 and second voltage 4. The controller provides a signal to adjustable voltage supply 12, which subsequently changes the electrical voltage across the span of material 1.

Operation

Thus, by applying known voltage 2 and grounding at third electrical-mechanical connection point 11, the span of material 1 will heat and contract. While the voltage is applied 2, the second voltage measurement 4 taken at fixed probe location 5 can be used to calculate the length of the conductive material 1, and subsequently to calculate the angle of pivoting beam 9. The calculated angle can then be used by the feedback controller 13 to compute the error between the true length and reference length 14 of the pivoting beam 9, and subsequently adjusts the voltage supply 12 which changes the applied voltage 2, changing the temperature of the material 1, causing it to change length, thereby reducing the error.

Advantages

The present invention allows sensing of position with minimal cost and complexity, and without complex models which can introduce errors. The technique is simple, only requiring knowledge of the applied voltage and one additional voltage measurement at a stationary point along the length of the material, and can easily be incorporated in practical devices. By making the dual measurements, the length of the material can be calculated directly and accurately, requiring no assumptions about ambient conditions or loads except that they are constant along the entire span length.

The present invention has particular benefits for shape memory alloy materials. It is not affected by hysteresis or by twinning or R-phase transformation or effects that may cause other methods to fail. This technique can be employed for an SMA material used as a sensor alone, used as an actuator and a sensor, or used in a feedback control system. A feedback control system can use the sensed position to control electrical current into the SMA material and drive it to a desired position or otherwise control the state of the actuator.

The invention accordingly provides an apparatus and a method for length sensing of a material using few electrical measurements. First, a voltage is applied across the length of material, the source attached in such a way to ensure the voltage spans the entire length of material even if it stretches or strains. Often this voltage is controlled or known or measured, and is considered the first measurement of voltage. A second measurement of voltage is then made across a known fixed-length section of the material within the span of the applied voltage. By multiplying the ratio of first voltage to second voltage by the known fixed length span, the entire length is calculated.

The present invention accordingly provides the apparatus and method for reliable and robust length sensing of a material in various embodiments. The principles, preferred embodiments, and modes of operation of the present invention have been described in the foregoing specification with regard to illustrative, non-limiting embodiments. The invention accordingly is not to be construed as limited to the particular forms disclosed as these are regarded as illustrative rather than restrictive. Moreover, variations and changes may be made by those skilled in the art without departing from the spirit of the invention described in the following claims.

We claim:

1. A method for estimating a length of an electrically conductive material, comprising the steps of:
   a. providing a span of electrically conductive material,
   b. applying a voltage across the entire said span of electrically conductive material from a base of said span to an opposing base thereof,
   c. determining a first voltage which is equal to the applied voltage across said span of electrically conductive material, said first voltage determined by use of a voltage sensor or by predetermined knowledge of said applied voltage; and
   d. measuring a second voltage at a fixed probe location within said span of conductive material, said fixed probe location being a predetermined distance from the base of said span of conductive material,
   wherein the fixed probe location changes when the length of said span changes, and whereby the length of said span of electrically conductive material is determined by computing the ratio of said first voltage to said second voltage and scaling that ratio by the distance from said base to said fixed probe.

2. The method of claim 1, wherein said span of electrically conductive material is a shape memory alloy.

3. The method of claim 2, wherein said applied voltage is varied to heat said conductive material or to allow it to cool, causing it to contract or extend.

4. The method of claim 1, further comprising using said length computation is used in a feedback control system.

5. The apparatus of claim 1, further comprising a feedback control system.

6. A method for estimating a length of an electrically conductive material, comprising the steps of:
   a. providing a span of electrically conductive material,
   b. applying a predetermined first voltage across said span of electrically conductive material from a first base of said span to an opposing second base thereof, and
   c. measuring a second voltage at a selected probe location within said span of electrically conductive material, said selected probe location being a predetermined distance from the base of said span of conductive material,
   wherein the selected probe location changes when the length of said span changes, and whereby the length of said span of conductive material is determined by computing the ratio of said first voltage to said second voltage and scaling that ratio by the distance of the fixed probe location from the base.

7. An apparatus for estimating a length of an electrically conductive material:
   a span of electrically conductive material supported between a first base and an opposing second base thereof,
   a source of electrical voltage attached at said second base of said span for applying a predetermined first voltage to said span; and
   a voltage probe having a sensor for measuring voltage and movable to a selected probe location within said span, said selected probe location being a predetermined distance from the first base of said span of conductive material, for determining a second voltage,
   wherein the selected probe location changes when the length of said span changes, and whereby the length of said span of conductive material is determined by computing the ratio of said first voltage to said second voltage and scaling that ratio by the distance of the selected probe location from the first base.

8. The apparatus of claim 7, wherein said span of electrically conductive material is a shape memory alloy.

* * * * *

UNITED STATES PATENT AND TRADEMARK OFFICE
CERTIFICATE OF CORRECTION

PATENT NO. : 10,466,030 B2
APPLICATION NO. : 15/593885
DATED : November 5, 2019
INVENTOR(S) : Austin R. Gurley, David G. Beale and Royall M. Broughton It is certified that error appears in the above-identified patent and that said Letters Patent is hereby corrected as shown below:

In the Specification

Column 1, Line 13 to Line 16, cancel the text beginning with:
"REFERENCE TO GOVERNMENT GRANT
This invention was supported by the Alabama Space Grant Consortium, NASA Training Grant NNX15AJ18H."

And insert the following text:
--STATEMENT REGARDING FEDERALLY SPONSORED RESEARCH OR DEVELOPMENT
This invention was made with Government support under NNX15AJ18H awarded by NASA. The Government has certain rights in the invention.--

Signed and Sealed this
Fourteenth Day of January, 2020

Andrei Iancu
*Director of the United States Patent and Trademark Office*